(12) United States Patent
Edelstein et al.

(10) Patent No.: US 7,067,437 B2
(45) Date of Patent: Jun. 27, 2006

(54) STRUCTURES WITH IMPROVED INTERFACIAL STRENGTH OF SICOH DIELECTRICS AND METHOD FOR PREPARING THE SAME

(75) Inventors: Daniel C. Edelstein, White Plains, NY (US); Alfred Grill, White Plains, NY (US); Vishnubhai V. Patel, Yorktown Heights, NY (US); Darryl D. Restaino, Modena, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/662,022

(22) Filed: Sep. 12, 2003

(65) Prior Publication Data

US 2005/0059258 A1 Mar. 17, 2005

(51) Int. Cl.
*H01L 21/31* (2006.01)
*H01L 21/469* (2006.01)

(52) U.S. Cl. ............. 438/761; 438/788; 438/791

(58) Field of Classification Search ............ 438/758, 438/680, 780, 761, 791, 788, 795
See application file for complete search history.

(56) References Cited

U.S. PATENT DOCUMENTS

| | | | |
|---|---|---|---|
| 6,072,227 A * | 6/2000 | Yau et al. ............... 257/642 |
| 6,251,770 B1 | 6/2001 | Uglow et al. | |
| 6,340,435 B1 * | 1/2002 | Bjorkman et al. ............ 216/72 |
| 6,399,489 B1 * | 6/2002 | M'Saad et al. ............ 438/680 |
| 6,465,372 B1 * | 10/2002 | Xia et al. ................. 438/787 |
| 6,570,256 B1 * | 5/2003 | Conti et al. ............... 257/761 |
| 6,593,247 B1 * | 7/2003 | Huang et al. ............. 438/758 |
| 6,713,390 B1 * | 3/2004 | M'Saad et al. ............ 438/680 |
| 6,806,207 B1 * | 10/2004 | Huang et al. ............. 438/758 |

\* cited by examiner

*Primary Examiner*—Alexander Ghyka
(74) *Attorney, Agent, or Firm*—Scully, Scott, Murphy & Presser, P.C.; Robert M. Trepp, Esq.

(57) ABSTRACT

A semiconductor device structure and method for manufacture includes a substrate having a top first layer; a second thin transition layer located on top of the first layer; and, a third layer located on top of the transition layer, wherein the second thin transition layer provides strong adhesion and cohesive strength between the first and third layers of the structure. Additionally, a semiconductor device structure and method for manufacture includes an insulating structure comprising a multitude of dielectric and conductive layers with respective transition bonding layers disposed to enhance interfacial strength among the different layers. Further, an electronic device structure incorporates layers of insulating and conductive materials as intralevel or interlevel dielectrics in a back-end-of-the-line ("BEOL") wiring structure in which the interfacial strength between different pairs of dielectric films is enhanced by a thin intermediate transition bonding layer.

9 Claims, 3 Drawing Sheets

STRUCTURES WITH IMPROVED INTERFACIAL STRENGTH OF SICOH DIELECTRICS AND METHOD FOR PREPARING THE SAME

BACKGROUND OF THE INVENTION

1. Field of the Invention

The present invention generally relates to a semiconductor electronic device structure comprising SiCOH (carbon-doped oxides) layers having improved interfacial strength (adhesive and cohesive strength near the interface) to other dielectric or conducting layers. The improved interfacial strength is caused by the presence of transition layers that are formed between the SiCOH layers and the other dielectric or conducting layers. The transition layers are formed in the present invention by starting the deposition of a specific layer, while a surface preparation plasma is still present and active in the reactor. Furthermore, the present invention relates to a method for improving the interfacial strength between different dielectric or conductive layers including those that include Si or C.

2. Description of the Prior Art

The continuous shrinking in dimensions of electronic devices utilized in ULSI circuits in recent years has resulted in increasing the resistance of the BEOL metallization without concomitantly decreasing the interconnect capacitances. Often interconnects are even scaled to higher aspect ratios to mitigate the resistance increases, leading to increased capacitances. This combined effect increases signal delays in ULSI electronic devices. In order to improve the switching performance of future ULSI circuits, low dielectric constant (k) insulators and particularly those with k significantly lower than silicon oxide are being introduced to reduce the capacitance.

The low-k materials that have been considered for applications in ULSI devices include polymers containing Si, C, O, such as methylsiloxane, methylsilsesquioxanes, and other organic and inorganic polymers which are fabricated by spin-on techniques or, Si, C, O and H containing materials (SiCOH, SiOCH, carbon-doped oxides (CDO), silicon-oxycarbides, organosilicate glasses (OSG)) deposited by plasma enhanced chemical vapor deposition (PECVD) techniques. The incorporation of the low-k dielectrics in the interconnect structures of integrated circuits (IC) often requires the use of other dielectric materials as diffusion barrier caps or etch-stop and chemo-mechanical polishing (CMP) hardmasks. The adhesion among the different layers in the complex structures of an IC device is often too low, resulting in delaminations during the processing of the device, or reduced reliability in response to thermomechanical stresses imposed by typical chip packaging materials. Often even when the adhesion is adequate, the deposited low-k film may possess degraded cohesive strength near the initial interface that is formed during deposition, and adhesion testing leads to fracture within this initial layer, which may be from single to single tens of nm thick. Without careful failure analysis, the low failure energies from adhesion testing of such cases may be mistakenly attributed to poor interfacial adhesion, rather than substandard cohesive strength of the near-interface low-k film. This is especially true for interfacial strength (adhesive and cohesive strength near the interface) of a carbon doped oxide dielectric comprised of Si, C, O and H (SiCOH) to other hardmask or diffusion barrier cap dielectics, such as SiN, SiC(H) or SiCN(H).

It would thus be highly desirable to provide a semiconductor device comprising an insulating structure including a multitude of dielectric and conductive layers with good interfacial strength among the different layers, and a method for manufacturing such semiconductor devices.

As described in U.S. Pat. No. 4,647,494, amorphous silicon (a-Si), on the order of tens of Angstroms thick, has been recognized for improving adhesion of wear resistant carbon coatings to metallic magnetic recording layers in recording tapes and disks. That is, a-Si is described in this prior art reference for improving adhesion between amorphous hydrogenated carbon (or diamondlike carbon) and silicide forming metals. Co-pending and co-assigned U.S. application Ser. No. 10/174,748, filed on Jun. 19, 2002 describes semiconductor structures wherein the adhesion between different layers is improved using an interfacial amorphous Si (a-Si) layer.

Despite the above use of a-Si, the adhesion between SiCOH interconnect dielectrics and other layers used in electronic device structures may be affected by the initial layer produced during the deposition of the SiCOH film. The properties of the initial layer may be dependent on the precursor used for the deposition of the film as well as the delay time between the initiation of the precursor flow into the reactor and the initiation of the plasma. Moreover, the initial layer may have different properties than that of the bulk SiCOH film.

As described in U.S. Pat. No. 6,251,770, a first undoped or fluorine-doped initial silicon oxide layer with substantially no carbon can be deposited underneath the carbon-containing organosilicate layer to increase the reactive ion etch selectivity. The organosilicate layer may also include an initial graded region starting from no carbon and increasing to a steady-state carbon level, to improve adhesion to the undoped silicon oxide layer. However adhesion improvement would only require ultrathin layers, which would not be sufficient to alter etch selectivity. Also, to be substantially free of carbon, a separate deposition step with different chemical precursors would be required.

As described in U.S. Pat. No. 6,570,256 a graded carbon layer can be employed within the initial region of a carbon-containing organosilicate layer to improve adhesion to the underlying substrate. However this may not necessarily provide the requisite properties of the organosilicate film near the interface, in particular with respect to adhesion and cohesive strength. If an oxide-like layer is desired within the organosilicate film, there is no means provided to achieve that.

It would thus be further highly desirable to provide a semiconductor device structure and method for manufacturing an insulating structure comprising a multitude of dielectric and conductive layers with improved interfacial strengths between SiCOH layers and other layers in the interconnect structure. It would also be highly desirable to achieve these improved interfacial strengths without introducing additional chemical precursors that would themselves deposit other materials besides the desired SiCOH low-k insulator material, and would allow continuous grading of the interfaces. It would also be highly desirable to achieve the above without introducing additional separate depositions of other film layers.

SUMMARY OF THE INVENTION

It is therefore an object of the present invention to provide an insulating structure comprising a multitude of dielectric and conductive layers with good interfacial strength between the different layers. The term "good interfacial strength" as used throughout this application denotes an interfacial strength of greater than 50% of the cohesive strength of the weaker of the two materials on either side of the interface.

It is a further object of the present invention to provide an insulating structure comprising a multitude of dielectric and conductive layers wherein the interfacial strength between SiCOH and other different layers is enhanced by starting the deposition of the new layer in a plasma reactor while a surface preparation plasma of the prior film's is still active, stopping the surface preparation plasma after a predetermined time and converting the plasma conditions for the deposition of the new film. A transition layer is formed by the inventive process between the previous surface and new dielectric layer, which enhances the adhesion between the previous surface and the new dielectric layer. The cohesive strength of this transition layer is itself enhanced by the use of an oxygen-bearing organosilicate precursor such as a cyclic siloxane, such that the transition plasma conditions can generate a carbon-depleted silicon oxide-like material restricted to within several nm of the interface.

It is another object of the present invention to provide an insulating structure comprising a multitude of dielectric and conductive layers wherein the surface preparation plasma may be a surface oxidation, an oxygen-containing plasma, a surface cleaning plasma of an inert gas, such as Ar or He, or any of the aforementioned plasmas further containing other elements, such as N, H and/or F.

It is another object of the present invention to provide an insulating structure comprising SiCOH layers with enhanced interfacial strength to other layers including, for example, SiN, SiC, SiCN, SiCH, SiCNH, $SiO_2$, tetraethylorthosilicate ("TEOS"), phosphorus silicate glass ("PSG") or boron phosphorus silicate glass ("BPSG").

It is yet another object of the present invention to provide an electronic device structure incorporating layers of insulating and conductive materials as intralevel or interlevel dielectrics in a back-end-of-the-line ("BEOL") wiring structure in which the adhesion between different dielectrics is enhanced through a transition layer formed by starting the deposition of the new layer in a plasma reactor while the surface preparation plasma of the prior film is still active, stopping the surface preparation plasma after a predetermined time and converting the plasma conditions for the deposition of the new film. BEOL wiring structures may also be referred to herein as an interconnect structure.

It is yet another object of the present invention to provide an electronic device structure in which the interfacial strength between a SiCOH layer and a SiCH or SiCNH layer is at least 4 $J/m^2$, and preferably equal to the cohesive strength of the SiCOH film itself (typically 6 $J/m^2$ for k=2.9 material) as measured by a four point bending test calibrated such that the cohesive strength of $SiO_2$ deposited by a silane process is measured as 10 $J/m^2$.

It is another object of the present invention to provide an insulating semiconductor structure comprising a multitude of dielectric and conductive layers wherein the interfacial strength between different layers is enhanced by starting the deposition of a new layer in a plasma reactor while the surface preparation plasma of the prior film's is still active, stopping the surface preparation plasma after a predetermined time and converting the plasma conditions for the deposition of the new film.

According to the principles of the invention, there is provided a method for fabricating a BEOL interconnect structure comprising SiCOH layers with enhanced interfacial strength to other layers of the interconnect including, for example, layers of SiN, SiC, SiCN, SiCH, SiCNH, $SiO_2$, TEOS, PSG or BPSG.

In one embodiment, a structure having a surface comprising areas of patterned metals and areas of SiCH or SiCHN dielectrics is placed into a PECVD reactor and then the structure is exposed to an Ar plasma for a first time period. After the first time period, the precursor used for the deposition of the SiCOH film is introduced in the reactor while the Ar plasma is still active for a second time period. The Ar flow is then interrupted and the plasma conditions are adjusted for the growth of the SiCOH film for a third period of time.

In another aspect of the invention, there is provided a method for fabricating a multilayered structure with strong interfacial strength between the different layers comprising the steps of: introducing a multilayered structure having at least one surface comprising areas of patterned metals and areas of SiCH or SiCHN dielectrics into a PECVD reactor; exposing the surface to an Ar plasma for a first time period; introducing precursors for deposition of a SiCOH film into the reactor, while the Ar plasma is still active; and interrupting the Ar plasma and adjusting plasma conditions for growth of the SiCOH film.

In another embodiment, the steps of exposing to Ar plasma, introducing precursors for deposition of a SiCOH film, while maintaining plasma active, and interrupting and adjusting are repeated any number of times.

In a different embodiment, the Ar pretreatment plasma is replaced by a surface oxidation, an oxygen-containing plasma, He plasma or any of the same, including the Ar plasma, containing other elements such as N, H and/or F.

In still another embodiment of the present invention, the structure is introduced into a PECVD reactor were the surface of the structure comprises areas of patterned metals and areas of SiCH or SiCHN dielectrics. This structure is then exposed to a surface cleaning or preparation plasma for a certain period of time. The surface cleaning plasma is stopped and a mixture containing the precursors used for the deposition of the SiCOH films with Ar, He, oxygen, $NH_3$, $SiH_4$ and mixtures thereof is introduced into the reactor and a plasma is initiated for the deposition of the film. The surface cleaning plasma may optionally include fluorine. After a first period of time, the flow of the additives to the precursors of the film is stopped and the deposition of the film is continued for a second period of time. In this embodiment, the first period of time is significantly smaller than the second period of time.

The interfacial strength enhancing method can be used in the back-end-of-the-line (BEOL) structure of a CMOS or DRAM device to improve the adhesion between a low-k dielectric, e.g., SiCOH, and hardmask or diffusion barrier dielectrics such as SiCH or SiCHN.

The present invention is further directed to an electronic device structure which has layers of insulating materials as intralevel or interlevel dielectrics in a back-end-of-the-line ("BEOL") interconnect structure which includes a preprocessed semiconducting substrate that has a first region of metal embedded in a first layer of insulating material, a first region of conductor embedded in a second layer of insulating material, a transition layer between the second layer of insulating material and first layer of insulating material, the first region of conductor is in electrical contact with the first region of metal, and a second region of conductor is in electrical contact with the first region of conductor and is embedded in a third layer of insulating material, the third layer of insulating material contacting with the second layer of insulating material. The electronic device structure may further comprise a dielectric cap layer situated in between the second layer of insulating material and the third layer of insulating material and including transition layers between the cap layer and the second and optionally the third insulating layers.

The electronic device structure may further comprise a first dielectric cap layer between the second layer of insulating material and the third layer of insulating material, and a second dielectric cap layer on top of the third layer of insulating material and containing transition layers between the cap layers and the insulating layers.

The dielectric cap material can be selected from silicon oxide, silicon nitride, silicon oxynitride, a refractory metal silicon nitride (wherein the refractory metal is selected from the group consisting of Ta, Zr, Hf and W), silicon carbide, carbon doped oxide or SiCOH and their hydrogenated compounds. The first and the second dielectric cap layers may be selected from the same group of dielectric materials. The first layer of insulating material may be silicon oxide or silicon nitride or doped varieties of these materials, such as phosphorus silicate glass ("PSG") or boron phosphorus silicate glass ("BPSG"), TEOS, SiC, SiCN, SiCH, or SiCNH. The second and subsequent dielectric layers may be PECVD deposited SiCOH or spin-on deposited dielectrics.

The electronic device structure may further include a diffusion barrier layer of a dielectric material deposited on at least one of the second and third layers of insulating material with a graded transition adhesion layer. The electronic device structure may further comprise a dielectric on top of the second layer of insulating material, which acts as a reactive ion etch ("RIE") hardmask and polish stop layer and a dielectric diffusion barrier layer on top of the dielectric RIE hardmask and polish stop layer, with an intermediate adhesion layer between said top dielectric and said second layer of insulating material. The electronic device structure may further comprise a first dielectric RIE hardmask/polish-stop layer on top of the second layer of insulating material, a first dielectric RIE hardmask/diffusion barrier layer on top of the first dielectric polish-stop layer, a second dielectric RIE hardmask/polish-stop layer on top of the third layer of insulating material, and a second dielectric diffusion barrier layer on top of the second dielectric polish-stop layer with transition layers between two layers of different materials. The electronic device structure may further comprise a dielectric cap layer of same materials as mentioned above, between an interlevel dielectric and an intralevel dielectric.

Advantageously, the method for improving the adhesion between the different layers of an electronic device structure described above is implemented in a back-end-of-the-line ("BEOL") wiring process.

The transition layer of the present invention is unlike prior art adhesion layers in that it contains the same elements as the next layer however at different concentrations and it may contain additional elements. The transition layer is typically characterized by a reduced C content and enhanced O content as compared to the following SiCOH layer. The transition layer of the present invention is self limited to less than ~10 nm from the interface. In some embodiments of the present invention in which SiCOH is being deposited, the transitional layer may be oxygen rich and/or carbon-depleted as compared to the SiCOH layer.

BRIEF DESCRIPTION OF THE DRAWINGS

The foregoing and other objects, features, and advantages of the invention will be apparent from the following detailed description of the invention, as illustrated in the accompanying drawings, in which.

DETAILED DESCRIPTION OF THE INVENTION

The present invention discloses a structure with improved interfacial strength between different layers of insulating or conductive materials. The improved interfacial strength is obtained in the present invention by forming thin transition layers between the different pairs of layers. The transition layer is formed while the plasma of a surface pretreatment step is still present and active in the reactor chamber at the same time the precursors of the film that is being deposited are introduced into the reactor chamber. The results are optimized in the case of siloxane or other oxygen-bearing organo-silicon precursors.

The present invention provides a method for improving the interfacial strength among different layers of insulating or conductive materials using thin transition layers between each of the different layers.

The transition layer of the present invention may be used to improve the interfacial strength between a PECVD deposited SiCOH dielectric and another dielectric such as Si-based SiCH, SiCNH, silicon oxide, silicon nitride, or organic dielectrics, or between any two dielectric layers comprising the aforementioned dielectrics. The dielectric layers may be the main interconnect dielectric, a cap, or a hardmask layer in the back-end-of-the-line interconnect structure of an integrated circuit. While the transition layer may have a different dielectric constant than the following dielectric, it is formed as a very thin layer as compared to the thickness of the dielectric layers, therefore its contribution to the effective dielectric constant is negligible. The transition layer of the present invention may also be used to improve the adhesion or interfacial strength between a metal or metal nitride and any dielectric layer selected from the aforementioned group.

Figure 1:
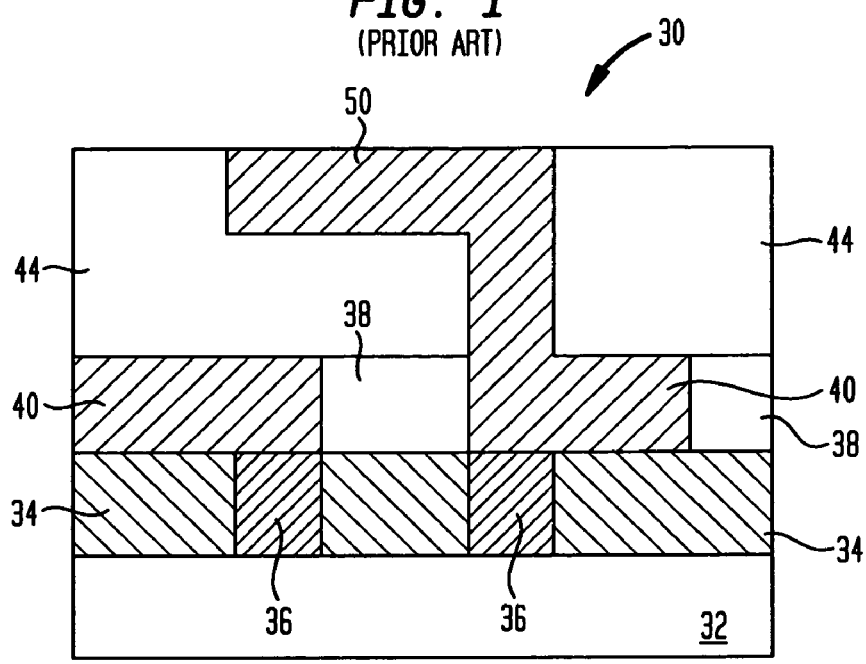
FIG. 1 depicts an enlarged, cross-sectional view of a prior art electronic device having two layers of metallization in the BEOL according to the current state of the art.

The electronic devices formed according to the present invention are shown in FIG. 2-5; FIG. 1 is a prior art electronic device. It should be noted that the devices shown in FIGS. 2–5, are merely illustrated as examples according to the present invention, while countless other devices can also be formed according to the present invention.

FIG. 1 depicts electronic device 30 that is built on a silicon substrate 32 according to the current state of the art; FIG. 1 is representative of the Prior Art and thus is labeled accordingly. On top of silicon substrate 32, insulating material layer 34 is formed with a first region of metal 36 embedded therein. After a chemical mechanical polishing ("CMP") process is conducted on first region of metal 36, a film such as a dielectric film 38, having preferably a dielectric constant less than $SiO_2$, is deposited on top of first layer of insulating material 34 and first region of metal 36. First layer of insulating material 34 may be suitably formed of silicon oxide, silicon nitride, doped varieties of these materials, or any other suitable insulating material. Dielectric film 38 is patterned by a photolithography process and conductor layer 40 is deposited therein. After a CMP process on first conductor layer 40 is carried out, second layer of dielectric film 44 is formed overlying first dielectric film 38 and first conductor layer 40. Conductor layer 40 may be a deposit of a metallic conductive material or a non-metallic conductive material. For instance, a metallic conductive material of aluminum or copper, or a non-metallic material such as nitride or polysilicon may be utilized. The first conductor 40 is in electrical communication with the first region of metal 36.

As further depicted in FIG. 1, a second region of conductor 50 is formed after a photolithographic process in the second dielectric film layer 44, followed by a process for depositing the second conductor material. Second conductor 50 may also be a deposit of either a metallic material or a non-metallic material, similar to that used in depositing the first conductor layer 40. The second region of conductor 50 is in electrical communication with the first region of conductor 40 and is embedded in the second layer of dielectric insulator 44. The second layer of dielectric film 44 is in intimate contact with the first layer of insulating material 38. In this specific example, the first layer of insulating material 38 serves as an intralevel dielectric material, while the second layer of insulating material, i.e., the dielectric film 44, serves as both an intralevel and an interlevel dielectric.

Figure 2:
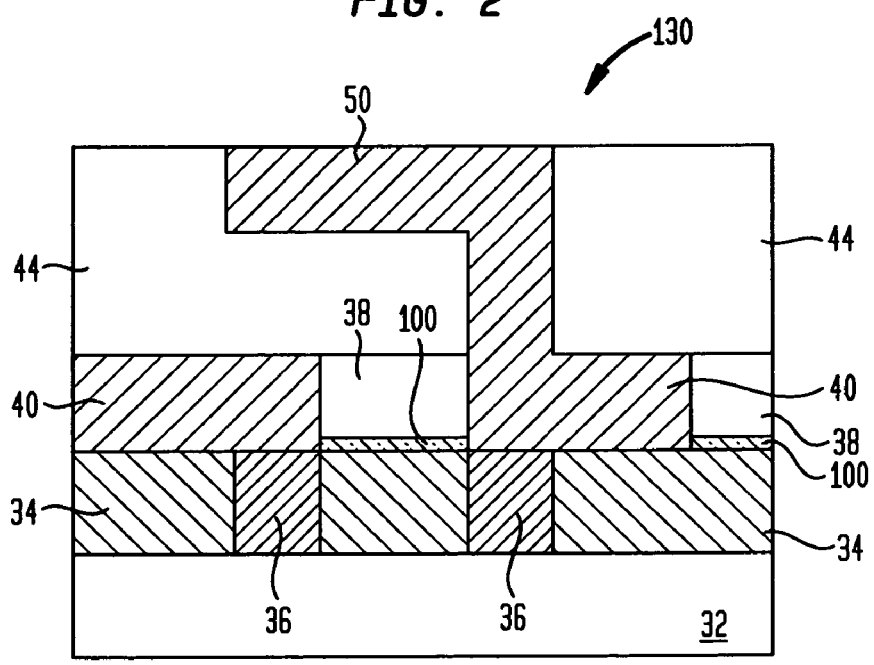
FIG. 2 depicts the structure of FIG. 1 with a transition layer between the dielectrics of the two-metallization levels according to the present invention.

FIG. 2 depicts electronic device 130 that is built on a silicon substrate 32 according to the present invention. After the formation of insulating material layer 34 with the embedded first region of metal 36, a thin transition layer 100, approximately 1 to about 100 nm thick, preferably about 10 to about 20 nm thick, is formed on top of layers 34 and 36. The process then continues as described with reference to FIG. 1.

Figure 3:
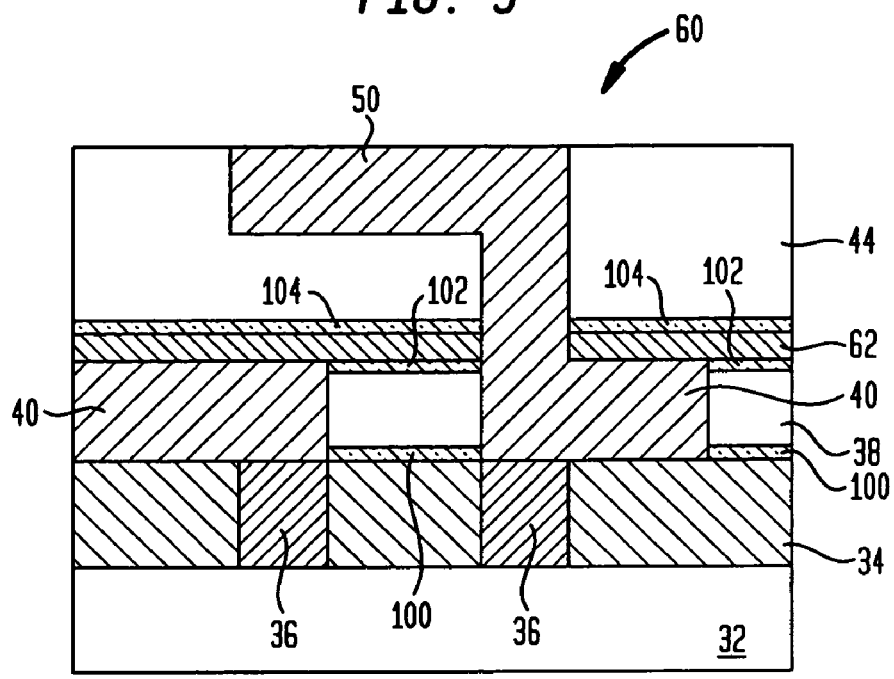
FIG. 3 depicts an enlarged, cross-sectional view of the electronic device structure of FIG. 2 having an additional diffusion barrier dielectric cap layer on top of the intralevel dielectric and transition layers between the diffusion barrier and the intralevel and interlevel dielectrics according to the present invention.

FIG. 3 depicts electronic device 60 according to the present invention, similar to that of electronic device 130 shown in FIG. 2, but with additional dielectric cap layer 62 deposited between first insulating material layer 38 and second insulating material layer 44. Dielectric cap layer 62 can be suitably formed of a material such as, for example, silicon oxide, silicon nitride, silicon oxynitride, silicon carbide (SiC), silicon carbide containing nitrogen (SiCN), silicon carbo-oxide (SiCO), modified SiCOH and their hydrogenated compounds, as well as refractory metal silicon nitride, wherein the refractory metal is selected the group consisting of Ta, Zr, Hf, and W. Additionally, dielectric cap layer 62 functions as a diffusion barrier layer for preventing diffusion of first conductor layer 40 into second insulating material layer 44.

In one embodiment of the present invention, the adhesion between cap layer 62 and dielectric layer 38 is enhanced by the transition layer 102. In another embodiment, the adhesion between dielectric layer 44 and cap layer 62 is enhanced by the transition layer 104. In yet another embodiment, the adhesion between cap layer 62 and dielectric layer 38 is enhanced by the transition layer 102 and the adhesion between dielectric layer 44 and cap layer 62 is enhanced by the transition layer 104.

Figure 4:
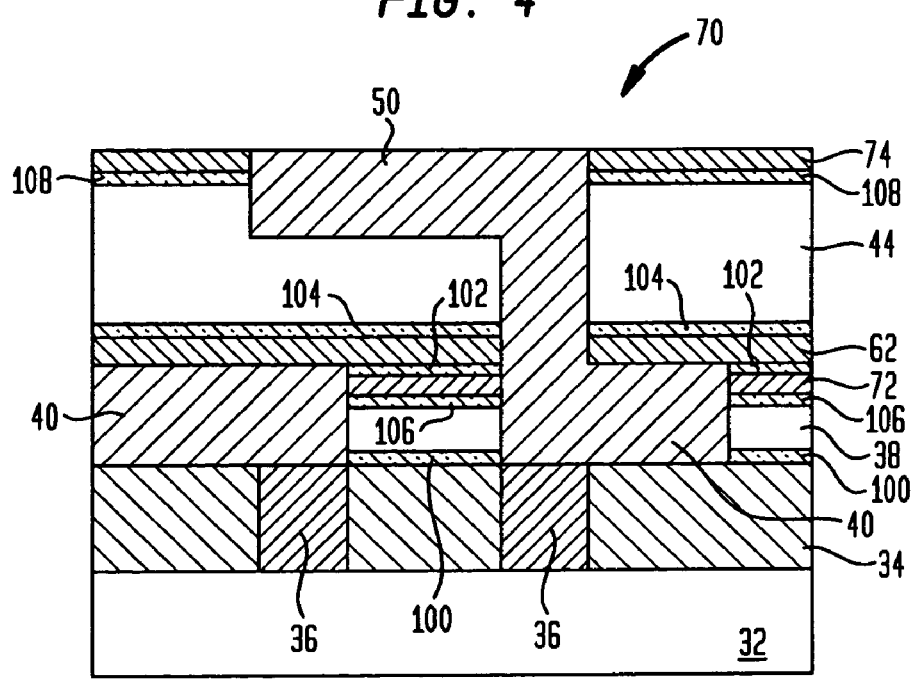
FIG. 4 depicts an enlarged, cross-sectional view of the electronic device structure of FIG. 3 having an additional RIE hardmask/polish-stop dielectric cap layer and dielectric cap diffusion barrier on top of the polish-stop layer with transition layers between the different dielectric layers according to the present invention.

FIG. 4 depicts another alternate embodiment of electronic device 70 according to the present invention. In electronic device 70, two additional dielectric cap layers 72 and 74 that act as an RIE mask and CMP (chemical-mechanical polishing) polish stop layer are used. First dielectric cap layer 72 is deposited on top of first insulating material layer 38. The function of dielectric layer 72 is to provide an end point for the CMP process utilized in planarizing first conductor layer 40. Polish stop layer 72 can be a deposit of a suitable dielectric material such as, for example, silicon oxide, silicon nitride, silicon oxynitride, silicon carbide (SiC), silicon carbide containing nitrogen (SiCN), silicon carbo-oxide (SiCO), modified SiCOH and their hydrogenated compounds, as well as refractory metal silicon nitride, wherein the refractory metal is selected from the group consisting of Ta, Zr, Hf, Ti and W. The top surface of dielectric layer 72 is at the same level as first conductor layer 40.

In one embodiment, the interfacial strength between cap layer 72 and dielectric layer 38 is enhanced by the transition layer 106. In another embodiment, the interfacial strength between dielectric layer 62 and cap layer 72 is enhanced by the transition layer 102. In yet another embodiment, the interfacial strength between cap layer 72 and dielectric layer 38 is enhanced by the transition layer 106 and the interfacial strength between dielectric layer 62 and layer 72 is enhanced by the transition layer 102.

A second dielectric layer 74 can be added on top of second insulating material layer 44 for the same purposes. In one embodiment, the interfacial strength between layer 74 and dielectric layer 44 is enhanced by the transition layer 108.

Figure 5:
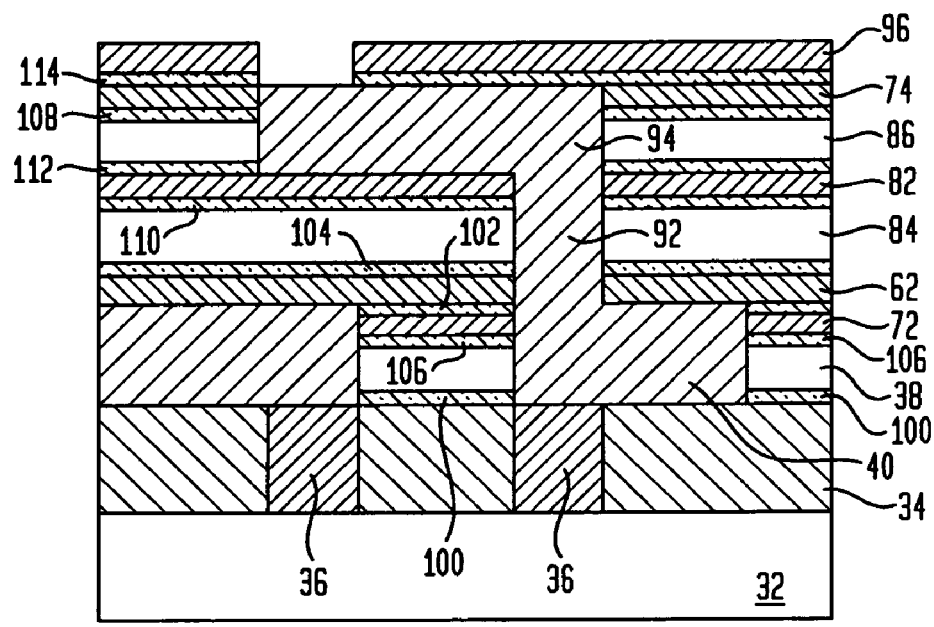
FIG. 5 depicts an enlarged, cross-sectional view of the electronic device structure of FIG. 4 having additional RIE hardmask/polish-stop dielectric layers on top of the inter-level dielectric material film with transition layers between the different dielectric layers according to the present invention.

FIG. 5 depicts still another alternate embodiment of electronic device 80 according to the present invention. In this alternate embodiment, an additional layer of dielectric 82 is deposited and thus divides second insulating material layer 44 into two separate layers 84 and 86. Intralevel and interlevel dielectric layer 44, as depicted in FIG. 4, is therefore divided into interlayer dielectric layer 84 and intralevel dielectric layer 86 at the boundary between interconnect 92 and interconnect 94, as depicted in FIG. 5. An additional diffusion barrier layer 96 is further deposited on top of the upper dielectric layer 74. The additional benefits provided by this alternate embodiment of the electronic structure 80 is that the dielectric layer 82 acts as a RIE etch stop providing superior interconnect depth control.

In one embodiment, the interfacial strength between layer 82 and dielectric layer 84 is enhanced by the transition layer 110. In another embodiment, the interfacial strength between layer 86 and layer 82 is enhanced by the transition layer 112. In yet another embodiment, the interfacial strength between cap layer 82 and dielectric layer 84 is enhanced by the transition layer 110 and the interfacial strength between dielectric layer 86 and layer 82 is enhanced by the transition layer 112. In another embodiment, the interfacial strength between the diffusion layer 96 and dielectric layer 74 is enhanced by the transition layer 114. In yet another embodiment, the interfacial strength between dielectric 74 and intralevel dielectric 86 is enhanced by the transition layer 108.

In any of the embodiments mentioned above, the transition layer may be oxygen rich and/or carbon-depleted, for example preparing it with addition of oxygen to the plasma feed during its preparation, or may be a result of the plasma condition during its deposition, especially in the case of siloxane precursors.

The transition layers in each of FIGS. 2–5 are formed utilizing the method of the present invention. As stated above, each transition layer typically has a thickness of from about 1 nm to about 100 nm, with a thickness of from about 5 to about 20 nm being more highly preferred. Specifically, the inventive method begins with positioning a substrate such as an interconnect structure into a reactor chamber in which a plasma can be generated. Suitable reactors include: plasma enhanced chemical vapor deposition reactors, high-density plasma reactors, sputtering chambers, and ion beam chambers. The reactor is evacuated and then the substrate is heated to a temperature of about 400° C. or less. Preferably, the substrate is heated to a temperature of from about 200° C. to about 400° C.

Next, the substrate is subjected to a surface pretreatment step in which at least one surface pretreatment gas is flown into the reactor at which time it is converted into a plasma. The at least one surface pretreatment gas that can be used in the surface pretreatment step includes an inert gas such as Ar, Ne, He, Xe and Kr; $H_2$; $NH_3$; $O_2$; $SiH_4$ and $O_2$; and mixtures thereof. In some embodiments, F atoms may also be introduced into the feed gas. The flow rate of the surface pretreatment gas may vary depending on the reactor system and the type of gas being introduced. The chamber pressure can range anywhere from 0.05 to 20 torr, but the preferred range of pressure operation is 1 to 10 torr. The surface pretreatment step occurs for a first period of time, which is typically from about 0.08 to about 2 min.

An RF power source is typically used to generate a plasma of the surface pretreatment gas. The RF power source may operate at either the high frequency range (on the order of about 100 W or greater); the low frequency range (less than 250 W) or a combination thereof may be employed. The high frequency power density can range anywhere from 0.1 to 2.0 $W/cm^2$ but the preferred range of operation is 0.2 to 1.0 $W/cm^2$. The low frequency power density can range anywhere from 0.0 to 1.0 $W/cm^2$ but the preferred range of operation is 0.2 to 0.5 $W/cm^2$. The chosen power levels must be low enough to avoid significant sputter etching of the exposed dielectric surface (<5 nanometers removal).

At this point of the process, a flow of precursors gases for the next layer, such as precursors for SiCOH dielectric deposition, are introduced into the reactor. The reactor at this point thus contains a plasma of the surface pretreatment gases still present and active within the reactor, yet the next layer's precursors gases are being introduced. The flows of the precursor gases into the reactor may vary and are dependent on the chemical and physical make-up of the layer that is being deposited. The flows of precursor reactants into the reactor occur for a second period of time, which is typically from about 0.03 to about 0.5 min. During the transition of these process steps, it is preferred, although may not be absolutely critical, to maintain a constant chamber pressure by allowing the throttle valve position to adjust due to the change of process gas flows. It is also preferred, but again may not be absolutely critical, to maintain the same power levels during the transition of these process steps in order to provide a more reproducible layered film.

After the second period of time, the flows of the gases used for the surface preparation are stopped, and the plasma conditions for the precursor gases are adjusted for the deposition of the next layer. The growth of the next layer occurs for a third period of time, which is typically from about 0.15 to about 5 min.

The above processing steps of the present invention may be repeated any number of times to provide a multilayered structure in which each successively deposited layer has a transition layer therebetween.

The layer that is being deposited after the surface pretreatment step is preferably a SiCOH type dielectric of low dielectric constant (k<3.2) or ultralow dielectric constant (k<2.4) and the substrate is an interconnect structure having an upper layer of a dielectric material such as SiCHN on which the transition layer and then the SiCOH type dielectric are formed thereon.

Qualitatively, the interfacial strength provided by the transition layer of the present invention is strong enough to prevent delamination or cohesive failure near the interface of the interconnect structure during fabrication and reliability testing. In one example, as determined in a four-point bending test known amongst skilled artisans, interfacial strength between SiCOH to SiCHN has been demonstrated to increase by almost a factor of three (3), from about 2.2 joule/$m^2$ to about 6.0 Joule/$m^2$. The method and electronic structures formed according to the present invention have therefore been thoroughly demonstrated in the above descriptions and in the drawings of FIGS. 2–5. It should be emphasized that the examples of the electronic structures shown in FIGS. 2–5 are merely used to illustrate the inventive method that can be applied in the fabrication of countless electronic devices.

The following examples are presented to illustrate the fabrication of the dielectric film including the transition layer in accordance with the present invention as well as to demonstrate advantages that can be obtained therefrom.

EXAMPLE 1

In this example, a wafer containing an electronic structure (i.e., substrate) having an upper layer of first dielectric with metal structures embedded in it was inserted in a plasma enhanced chemical vapor deposition ("PECVD") reactor. The wafer was then heated to a temperature between room temperature and 450° C. In typical conditions, the wafer was heated to 180° C. Argon (Ar) was then flown into the reactor. In one example, Ar was flown into a 8" the reactor at a rate of 30 sccm to achieve a pressure of 100 mTorr. A high frequency RF power source connected to the substrate holder was then turned on to about 60.0 W for 0.5 to 2 minutes. In a different example, the RF power generated was operated under bias control at a bias of −250 VDC. Without interrupting the plasma, the precursor mixture used for the deposition of the next dielectric film was then flown into the reactor keeping the power and pressure unchanged until the flow was stabilized an then for an additional 5–15 seconds. The Ar flow was then shut off and the plasma conditions were adjusted for the deposition of the dielectric. The dielectric can be SiCOH. This achieved an interfacial strength of 5.8 $J/m^2$ between SiCOH and SiCNH.

EXAMPLE 2

In this example, a wafer containing an electronic structure (i.e., substrate) having an upper layer of first dielectric with metal structures embedded in it was inserted in a 300 mm PECVD reactor. The wafer was heated to 350° C. Ar was then flown into the reactor at 900 sccm to achieve a pressure of 4 torr. A high frequency RF power source was then turned on to about 300 W and a low frequency RF source to about 150 W for about 20 seconds. Without interrupting the plasma, the precursor mixture used for the deposition of the next dielectric film was then flown into the reactor and the power and pressure conditions were adjusted for the deposition of the SiCOH dielectric. The flow of Ar was maintained for an additional 5–15 seconds after which it was turned off and the deposition of the dielectric continued until the required thickness was obtained. This achieved an interfacial strength of 4.3 J/m² between SiCOH and SiCNH.

In these examples, TEM/EELS, Auger, and SIMS data confirm a modification of the interface and SiCOH film within ~10 nm wherein this transition layer is sharply carbon-depleted (but not zero) and sharply SiO rich, with a plateau of slightly carbon-depleted material immediately prior to the steady state bulk region. By contrast a control sample with poor interfacial strength shows no carbon depletion and no SiO-rich spike, and in fact shows a carbon overshoot at or near the interface.

EXAMPLE 3

In a different example, the procedure is similar to that in Example 1 or Example 2 but the pretreatment gas was He, $O_2$, $NH_3$, or mixtures of Ar or He with $O_2$, $H_2$, $NH_3$, $SiH_4$.

During the second time period in the examples described above, a transition dielectric film was deposited under the additional influence of the pretreatment gas. This influence can be physical ion bombardment if the pretreatment gas was inert, such as Ar, or it can be physico-chemical if the pretreatment gas mixture contained reactive gases such as $O_2$.

EXAMPLE 4

In this example, a wafer containing an electronic structure (i.e., substrate) having an upper layer of a first dielectric with metal structure embedded in it was inserted into a 300 nm PECVD reactor. The wafer was heated to 350° C. and then Ar was flown into the reactor at 900 sccm to achieve a pressure of 4 torr. A high frequency RF power source was then turned on to about 300 W and a low frequency RF source to about 150 W for about 20 seconds. The plasma was interrupted and a flow of the precursor gas mixture used for the deposition of the next dielectric film with the addition of Ar at a flow of 900 sccm was introduced into the reactor. A plasma was initiated at conditions adjusted from the deposition of the SiCOH dielectric. After 2–15 seconds, the Ar flow was turned off and the deposition of the dielectric was continued until the required thickness was obtained. Oxygen may be added to the Ar during the initial 2–15 seconds.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. A method for improving the interfacial strength including adhesion and cohesion between two different layers, said method comprising:
    positioning a substrate having an upper first layer of dielectric or conductive material in a reactor chamber that is capable of generating a plasma;
    exposing said upper first layer to a surface preparation plasma for a first period of time;
    introducing precursors of a second layer to be deposited atop of the upper first layer for a second period of time, while the surface preparation plasma is active in the reactor thereby forming a transition layer that is oxygen rich, carbon depleted or both oxygen rich and carbon depleted, said transition layer provides improved interfacial strenath between said upper first layer and said second layer; and
    stopping the surface pretreatment plasma at the end of the second period of time and adjusting plasma parameters for deposition of said second layer.

2. The method of claim 1 wherein the reactor comprises a plasma enhanced chemical vapor deposition reactor, a high-density plasma reactor, a sputtering chamber, or an ion beam chamber.

3. The method of claim 1 wherein said first layer is a dielectric selected from the group consisting of silicon oxide, silicon nitride, silicon oxynitride, SiC, SiCH, SiCN, SiCHN, and SiCOH.

4. The method of claim 1 wherein said second layer is a dielectric that is different from the first layer and is selected from the group consisting of silicon oxide, silicon nitride, silicon oxynitride, SiC, SiCH, SiCN, SiCHN, and SiCOH.

5. The method of claim 1 wherein said surface preparation plasma comprises a surface pretreatment gas selected from the group consisting of an inert gas, $H_2$, $0_2$, $NH_3$, $SiH_4$ and mixtures thereof.

6. The method of claim 5 wherein said surface pretreatment gas further comprises F atoms.

7. The method of claim 1 wherein the substrate is an interconnect structure.

8. The method of claim 1 wherein said reactor comprises an RF power source for generating said plasmas.

9. The method of claim 1 wherein the surface preparation plasma comprises Ar gas and said second layer is a dielectric comprising Si, C, O and H.

* * * * *